US010607993B2

(12) United States Patent
Hutin et al.

(10) Patent No.: US 10,607,993 B2
(45) Date of Patent: Mar. 31, 2020

(54) QUANTUM DEVICE WITH SPIN QUBITS

(71) Applicants: COMMISSARIAT A L'ENERGIE ATOMIQUE ET AUX ENERGIES ALTERNATIVES, Paris (FR); CENTRE NATIONAL DE LA RECHERCHE SCIENTIFIQUE, Paris (FR)

(72) Inventors: Louis Hutin, Saint-Martin-le-Vinoux (FR); Silvano De Franceschi, Grenoble (FR); Tristan Meunier, Grenoble (FR); Maud Vinet, Claix (FR)

(73) Assignees: COMMISSARIAT A L'ENERGIE ATOMIQUE ET AUX ENERGIES ALTERNATIVES, Paris (FR); CENTRE NATIONAL DE LA RECHERCHE SCIENTIFIQUE, Paris (FR)

( * ) Notice: Subject to any disclaimer, the term of this patent is extended or adjusted under 35 U.S.C. 154(b) by 0 days.

(21) Appl. No.: 15/967,778

(22) Filed: May 1, 2018

(65) Prior Publication Data

US 2018/0331108 A1 Nov. 15, 2018

(30) Foreign Application Priority Data

May 11, 2017 (FR) ...................................... 17 54156

(51) Int. Cl.
*H01L 39/22* (2006.01)
*H01L 27/105* (2006.01)
(Continued)

(52) U.S. Cl.
CPC ......... *H01L 27/1052* (2013.01); *G06N 10/00* (2019.01); *H01L 23/5226* (2013.01);
(Continued)

(58) Field of Classification Search
CPC ............. H01L 27/1052; H01L 23/5226; H01L 29/66977; H01L 29/66984;
(Continued)

(56) References Cited

U.S. PATENT DOCUMENTS

| 7,180,087 B1* | 2/2007 | Loss ...................... B82Y 10/00 |
| | | 257/9 |
| 9,971,970 B1* | 5/2018 | Rigetti ................... G06N 10/00 |
| 2002/0152191 A1* | 10/2002 | Hollenberg ............ B82Y 10/00 |

OTHER PUBLICATIONS

French Preliminary Search Report dated Jan. 29, 2018 in French Application 17 54156, filed on May 11, 2017 (with English Translation of Categories of cited documents).
(Continued)

*Primary Examiner* — Cuong B Nguyen
*Assistant Examiner* — Samuel Park
(74) *Attorney, Agent, or Firm* — Oblon, McClelland, Maier & Neustadt, L.L.P.

(57) ABSTRACT

A quantum device with spin qubits, comprising:
  a first semiconducting layer comprising a first matrix of data qubits and measurement qubits connected to each other through tunnel barriers;
  means of addressing qubits configured for controlling conduction of each tunnel barrier by the field effect and comprising:
    first and second conducting portions arranged in first and second superposed metallisation levels respectively;
    first and second conducting vias each comprising a first end connected to one of the first and second conducting portions respectively, and a second end located facing one of the tunnel barriers;
  a first dielectric layer interposed between the tunnel barriers and the second ends of the first and second conducting vias.

17 Claims, 8 Drawing Sheets

(51) Int. Cl.
　　*G06N 10/00*　　　(2019.01)
　　*H01L 23/522*　　(2006.01)
　　*H01L 29/66*　　　(2006.01)
　　*H01L 29/76*　　　(2006.01)
　　*H01L 29/786*　　(2006.01)

(52) U.S. Cl.
　　CPC .. *H01L 29/66977* (2013.01); *H01L 29/66984* (2013.01); *H01L 29/7606* (2013.01); *H01L 29/78642* (2013.01); *H01L 29/78645* (2013.01)

(58) Field of Classification Search
　　CPC ......... H01L 29/78645; H01L 29/78642; H01L 29/7606; G06N 10/00
　　See application file for complete search history.

(56) References Cited

OTHER PUBLICATIONS

Vandersypen, L., et al. "Interfacing spin qubits in quantum dots and donors—hot, dense, and coherent", arxiv.org, Cornell University Library, 2016, 13 pages.

Fowler, A., et al. "Surface codes: Toward practical large-scale quantum computation", Physical Review A (Atomic, Molecular, and Optical Physics), vol. 86, No. 3, 2012, 54 pages.

Hanson, R., et al. "Single-shot readout of electron spins in a semiconductor quantum dot", Physica E—Low-Dimensional Systems and Nanostructures, vol. 34, No. 1-2, 2006, 5 pages.

\* cited by examiner

QUANTUM DEVICE WITH SPIN QUBITS

TECHNICAL DOMAIN AND PRIOR ART

The invention relates to the field of quantum information processing, or quantum computing. The invention relates particularly to a quantum device with spin quantum bits or qubits.

In this field, error correction codes called "surface code" exist to compensate for imperfections of qubits, to repair loss of quantum information and thus perform very complex quantum calculations. Qubit matrices are made to implement this type of error correction code, for example with silicon, in the form of a two-dimensional matrix 1 as shown on FIG. 1.

Figure 1:
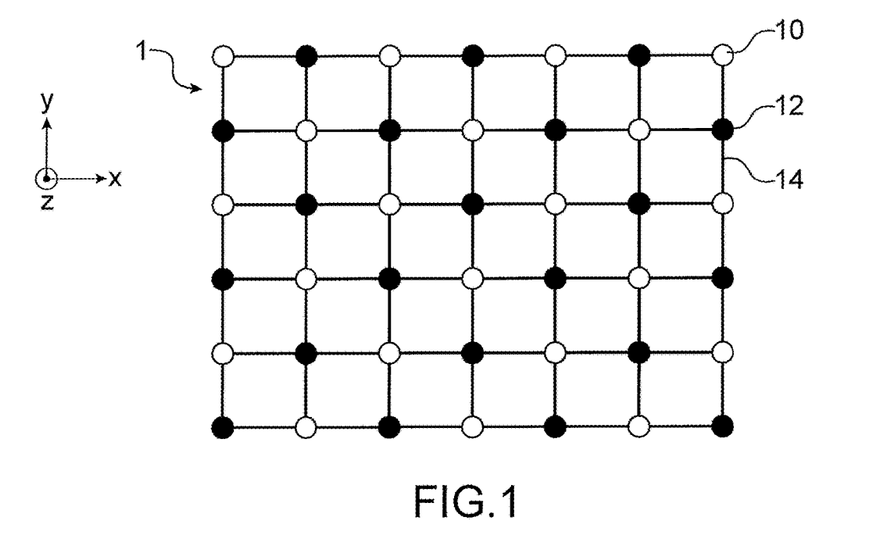
FIG. 1 diagrammatically shows a two-dimensional spin qubits matrix.

On this FIG. 1, the white circles having the reference 10 represent data qubits and the black circles having the reference 12 represent measurement qubits. Adjacent qubits 10, 12 are connected to each other through tunnel barriers 14. In this matrix 1, data qubits 10 are staggered from each other, and measurement qubits 12 are staggered from each other. These qubits 10, 12 are aligned and arranged in the form of rows and columns. Finally, the qubits 10, 12 are arranged such that each data qubit 10 is connected to either two (for a data qubit 10 arranged at a corner of the matrix), three (for a data qubit 10 arranged at an edge of the matrix) or four (for all other data qubits 10 that are arranged neither at a corner nor at the edge of the matrix) measurement qubits 12, and each measurement qubit 12 is connected to either two (for a measurement qubit 12 arranged at a corner of the matrix), three (for a measurement qubit 12 arranged at an edge of the matrix) or four (for all other measurement qubits 12 that are arranged neither at a corner nor at the edge of the matrix) data qubits 10.

If such a matrix 1 of qubits is to be functional, at least each measurement qubit 12 (and possibly the data qubits 10) must be coupled to a detection element (not shown on FIG. 1), the operation of which is comparable to the operation of a "Single Electron Transistor" (SET), to detect whether or not a charge is present on the qubit to which the detection element is coupled. It must also be possible to use this detection element to send or receive a charge carrier (electron or hole) from or to at least one of the measurement qubits 12 (and if possible also on at least one of the data qubits 10).

A first problem that arises with such a qubits matrix 1 applies to the addressing of qubits 10, 12 that must be made in such a structure. Each measurement qubit 12 and possibly each data qubit 10 must be connected to an electrical connection forming an electrical access to this qubit from outside the matrix 1. For example, considering a 3×3 qubits matrix (nine qubits arranged in the form of a square of three rows and three columns), the production of the electrical addressing connections to each of these nine qubits requires at least two levels of electrical interconnections: a first level for the central qubit of this matrix and a second level for the other qubits around this central qubit. This is a because the distance between qubits is too small for all electrical connections to the qubits to be made in a single electrical interconnections level Considering a 5×5 matrix, namely twenty-five qubits, at least three levels of electrical interconnections are necessary. In general, for an n×n qubits matrix, n/2 levels of electrical interconnections are necessary when n is even, and (n+1)/2 electrical interconnection levels are necessary when n is odd. When n is large, for example more than about 40 or even more than about 30, the number of electrical interconnection levels because much too high for these levels to be fabricated in practice.

A second problem that arises with such a matrix 1 applies to the fabrication of detection elements to be coupled to the qubits. Considering the dimensions required to fabricate the qubits (for example, two adjacent qubits being separated from each other by a distance between about 5 nm and 100 nm, and each qubit has lateral dimensions, for example a diameter, between about 5 nm and 100 nm), it is difficult to envisage the production of these detection elements within this qubits matrix 1.

Furthermore, a third problem that arises with such a matrix 1 is that in the same was as for addressing qubits, addressing of detection elements is problematic due to the large number of electrical connections that have to be made.

PRESENTATION OF THE INVENTION

Thus there is a need to propose a quantum device with spin qubits in which qubits arranged by forming a two-dimensional matrix are addressed with a smaller number of electrical interconnection levels.

To achieve this, one embodiment discloses a quantum device with spin qubits, comprising at least:
- a first semiconducting layer comprising a first matrix of data qubits and measurement qubits connected to each other through tunnel barriers;
- means of addressing data qubits and measurement qubits configured for controlling conduction of each tunnel barrier by the field effect and comprising at least:
  - first and second electrically conducting portions arranged in first and second superposed metallisation levels respectively;
  - first and second electrically conducting vias each comprising a first end connected to one of the first and second electrically conducting portions respectively, and a second end located facing one of the tunnel barriers;
- a first dielectric layer interposed between the tunnel barriers and the second ends of the first and second electrically conducting vias.

Therefore in this device, it is proposed to address data qubits and measurement qubits with electrostatic gates formed by electrically conducting vias positioned facing tunnel barriers connecting the qubits, rather than using electrical connections connected to these qubits directly. These electrically conducting vias are polarised by means of conducting portions of metallisation levels. Each conducting via forms an electrostatic control gate of one of the tunnel barriers connecting the qubits together. These control gates are arranged in a matrix.

An individual qubit can be controlled from row and column addressing of tunnel barriers (for example two, three or four depending on the position of the addressed qubit within the matrix) connected to this qubit and controlled by electrostatic gates formed facing these tunnel barriers.

It is possible that in optimisation modes, electrostatic potentials of tunnel barriers of qubits adjacent to the addressed qubit can also be controlled because the control of electrostatic potentials of tunnel barriers connected to the addressed qubit can impact adjacent qubits connected to these tunnel barriers. However, when a qubit is addressed, this qubit is connected to a larger number of tunnel barriers for which the electrostatic potentials are controlled than adjacent qubits due to the row and column addressing made.

With such addressing means, it is possible to make individual addressing of each data or measurement qubit using only two metallisation levels, regardless of the size of the qubits matrix and the number of qubits included in this matrix.

The tunnel barriers can be formed from narrower semiconductor portions than those forming the qubits. Such narrower semiconductor portions are called "constrictions".

Each data qubit can be connected to at least two adjacent measurement qubits and each measurement qubit can be connected to at least two adjacent data qubits.

The quantum device may be such that:
  in the first matrix, the data qubits and the measurement qubits are aligned in first and second directions perpendicular to each other forming rows and columns of the first matrix;
  the second ends of the first electrically conducting vias are arranged facing some of the tunnel barriers called the first tunnel barriers, each connecting one of the data qubits and one of the adjacent measurement qubits and located on the same row of the first matrix;
  the second ends of the second electrically conducting vias are arranged facing some of the other tunnel barriers called the second tunnel barriers, each connecting one of the data qubits and one of the adjacent measurement qubits and located on the same column of the first matrix.

Each of the first electrically conducting portions may be connected to the first ends of the first conducting vias, the seconds ends of which are facing the first tunnel barriers connecting the data qubits and the measurement qubits located on two adjacent columns of the first matrix, and each of the second electrically conducting portions may be connected to the first ends of the second conductor vias, the second ends of which are facing the second tunnel barriers connecting the data qubits and the measurement qubits located on two adjacent rows of the first matrix.

In a first embodiment, the quantum device may also comprise a second semiconducting layer comprising a second charge detectors matrix, for example with each comprising one quantum dot, each of the measurement qubits possibly being electrically connected to one of the charge detectors through a first semiconducting portion extending between the first and second semiconducting layers, each of the first semiconducting portions possibly being coupled to at least one gate configured for controlling tunnel coupling between the charge detector and the measurement qubit connected through said first semiconducting portion. In this case, each of the first gates controls electrical conduction within one of the first semiconducting portions each of which connects one of the measurement qubits to one of the charge detectors. In this configuration, the semiconducting level in which charge detectors are made is not the same as the level in which the data qubits and the measurement qubits are located. Such a configuration solves density problems when making qubits encountered in structures according to prior art, and therefore can be used to make small data qubits and measurements qubits (for example the spacing between two adjacent qubits being between about 5 nm and 100 nm, and the lateral dimensions, for example the diameter, of each qubit being between about 5 nm and 100 nm). Constraints relate to making the second matrix of charge detectors are also reduced.

Furthermore, in the first embodiment, each of the first semiconducting portions may be coupled to a first and to a second gate configured for controlling tunnel coupling between the charge detector and the measurement qubit connected through said first semiconducting portion and that are distinct and at a distance from each other, and the quantum device may also include:
  third electrically conducting portions each connected to first gates located around first semiconducting portions connected at least to measurement qubits located on the same column of the first matrix;
  fourth electrically conducting portions each connected to second gates located around first semiconducting portions connected at least to measurement qubits located on the same row of the first matrix.

In the first embodiment, the first and second gates may be coating and each may be located around one of the first semiconducting portions.

In a second embodiment, the quantum device may also comprise a second semiconducting layer and a second charge detectors matrix formed from second semiconducting portions extending between the first and second semiconducting layers, each of said second semiconducting portions possibly being connected by at least one third tunnel barrier to at least one of the measurement qubits located in the plane of the first semiconducting layer, around said second semiconducting portion.

Unlike the first embodiment in which said charge conductors are fabricated within the second semiconducting layer and in which the first semiconducting portions connect these charge detectors at least to the measurement qubits, the second embodiment discloses a means of fabricating charge detectors using the second semiconducting portions that extend between the first and the second semiconducting layers. In this second embodiment, the charge detectors are not addressed through the first and second gates formed around the first semiconducting portions, instead they are addressed by means of data qubit and measurement qubit addressing means that also act on conduction of the third tunnel barriers that connect the charge detectors to at least the measurement qubits. The advantage of this second embodiment is that there is no need to make coating gates between two semiconducting layers.

According to one advantageous configuration of this second embodiment, each of the second semiconducting portions may be connected by at least two third tunnel barriers to at least two measurement qubits located in the plane of the first semiconducting layer around said second semiconducting portion. The quantum device according to this configuration has the advantage that it reduces the number of charge detectors used by putting charge detectors in common for at least several measurement qubits.

Advantageously, each data qubit may be connected to one of the charge detectors.

In this case, in the first embodiment, each data qubit may be electrically connected to one of the charge detectors through one of the first semiconducting portions that can be coupled to at least one gate configured for controlling tunnel coupling between the charge detector and the data qubit connected through said first semiconducting portion. Furthermore, as for the first semiconducting portions connecting charge detectors to the measurement qubits, each of the first semiconducting portions connecting the charge connectors to the data qubits may be coupled to a first and to a second gate configured for controlling tunnel coupling between the charge detector and the data qubit connected through said first semiconducting portion and that are distinct and at a distance from each other, and in this case with:
  third electrically conducting portions each connected to first gates located around first semiconducting portions connected at the data qubits located on the same column of the first matrix;

fourth electrically conducting portions each connected to second gates located around first semiconducting portions connected to data qubits located on the same row of the first matrix.

For these first semiconducting portions connecting charge detectors to data qubits, it is possible that the first and second gates are coating and each is located around one of these first semiconducting portions.

In the second embodiment, when each of the data qubits is connected to one of the charge detectors, each of said second semiconducting portions may be connected by at least one third tunnel barrier to at least one of the measurement or data qubits located in the plane of the first semiconducting layer, around said second semiconducting portion. Furthermore, each of the second semiconducting portions may be connected by four third tunnel barriers to at least two measurement qubits and two data qubits located in the plane of the first semiconducting layer around said second semiconducting portion.

The first semiconducting layer may be located between the second semiconducting layer and the first and second metallisation levels.

The second semiconducting layer may also comprise doped portions configured for forming charge carrier reservoirs to which the charge detectors are connected by means of fourth tunnel barriers.

According to one advantageous configuration, each of the doped portions may be connected to several charge detectors arranged on a same row or a same column of the second matrix. Putting doped portions in common at several charge detectors is advantageous because there is no need to make an individual control of the fourth tunnel barriers.

The quantum device may also comprise second gates configured for controlling conduction of each of the fourth tunnel barriers by the field effect. The second gates may be formed by fifth electrically conducting portions extending parallel to the rows or columns of the first matrix, arranged facing the fourth tunnel barriers and spaced from the fourth tunnel barriers by a second dielectric layer. Furthermore, the fifth electrically conducting portions may be formed in a conducting level such that the second semiconducting layer is located between the first semiconducting layer and the conducting level.

Each of the fifth electrically conducting portions may form several second gates.

Another embodiment relates to a method of making a quantum device with spin qubits, comprising at least:
fabrication of a first data qubits and measurement qubits matrix in a first semiconducting layer, connected to each other through tunnel barriers;
fabrication of a first dielectric layer on the first semiconducting layer;
fabrication of first and second electrically conducting portions arranged in first and second superposed metallisation levels respectively;
fabrication of first and second electrically conducting vias each comprising a first end connected to one of the first and second electrically conducting portions respectively, and a second end facing one of the tunnel barriers such that the first dielectric layer is interposed between the tunnel barriers and the second ends of the first and second electrically conducting vias.

BRIEF DESCRIPTION OF THE DRAWINGS

This invention will be better understood after reading the description of example embodiments given purely for information and that are in no way limitative with reference to the appended drawings on which.

Identical, similar or equivalent parts of the different figures described below have the same numeric references to facilitate comparison between the different figures.

The different parts shown on the figures are not necessarily all at the same scale, to make the figures more easily understandable.

It must be understood that the different possibilities (variants and embodiments) are not mutually exclusive and that they can be combined with each other.

DETAILED PRESENTATION OF PARTICULAR EMBODIMENTS

Refer firstly to FIGS. 2 to 5 that diagrammatically show part of a first embodiment of a quantum device 100.

The quantum device 100 comprises spin qubits arranged in a "surface code" type matrix as described above with reference to FIG. 1. The spin qubits are made within a semiconducting layer 102, for example comprising silicon. Reference 104 designates data qubits and reference 106 designates measurement qubits. The lateral dimensions of each of the qubits 104, 106 (in the (X,Y) plane), for example a diameter or a side, are between about 5 nm and 100 nm and advantageously equal to about 40 nm, and their thickness is for example between about 5 nm and 30 nm. The distance between two adjacent qubits 104, 106 located on the same row or the same column of the matrix may for example be between about 5 nm and 100 nm, and advantageously of the order of 40 nm.

In this matrix, the data qubits 104 are staggered from each other, and the measurement qubits 106 are staggered from each other. These qubits 104, 106 are arranged in the form of rows and columns. Finally, the qubits 104, 106 are arranged such that each data qubit 104 is connected to two (when the qubit is arranged at a corner of the matrix), or three (when the qubit is arranged at an edge of the matrix), or four (for other qubits that are not arranged at a corner or at an edge of the matrix) measurement qubits 106, and that similarly, each measurement qubit 106 is connected to two, three or four data qubits 104.

The qubits 104, 106 are interconnected to each other through tunnel barriers 108 corresponding to semiconducting portions of the layer 102. The spacing between two adjacent qubits located on the same row or the same column of the matrix corresponds to the length of one of the tunnel barriers 108. The thickness of the semiconducting portions forming the tunnel barriers 108 may for example be similar to the thickness of those forming the qubits 104, 106, in other words between about 5 nm and 30 nm, and their width is less than the lateral dimensions (for example the diameter) of qubits 104, 106, for example between about 5 nm and 40 nm.

Figure 2:
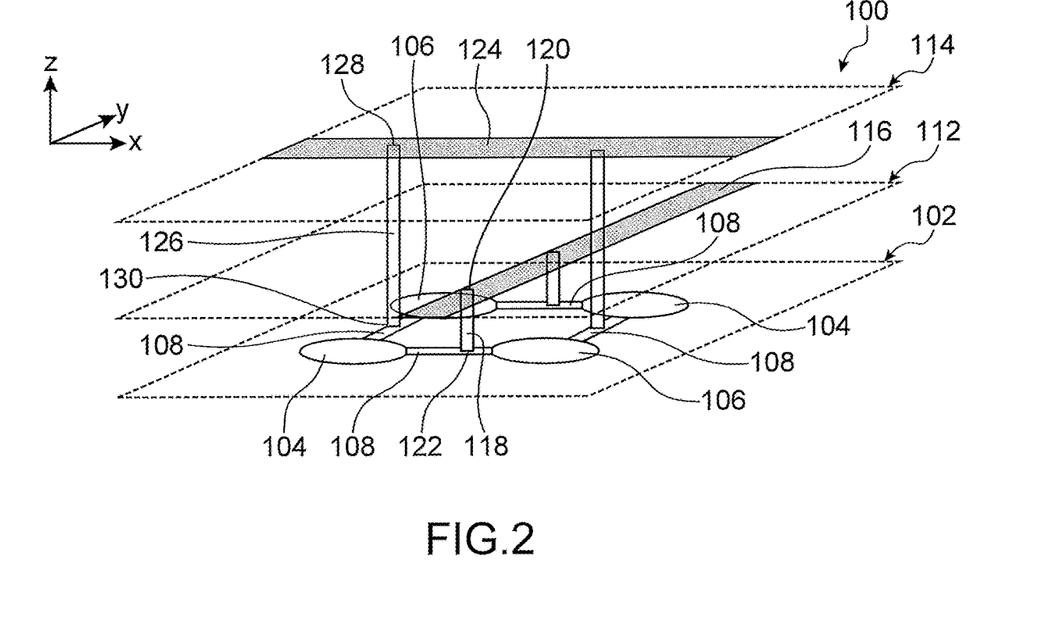
FIGS. 2 to 5 correspond to different diagrammatic views of a part of a quantum device according to a first embodiment.
Figure 3:
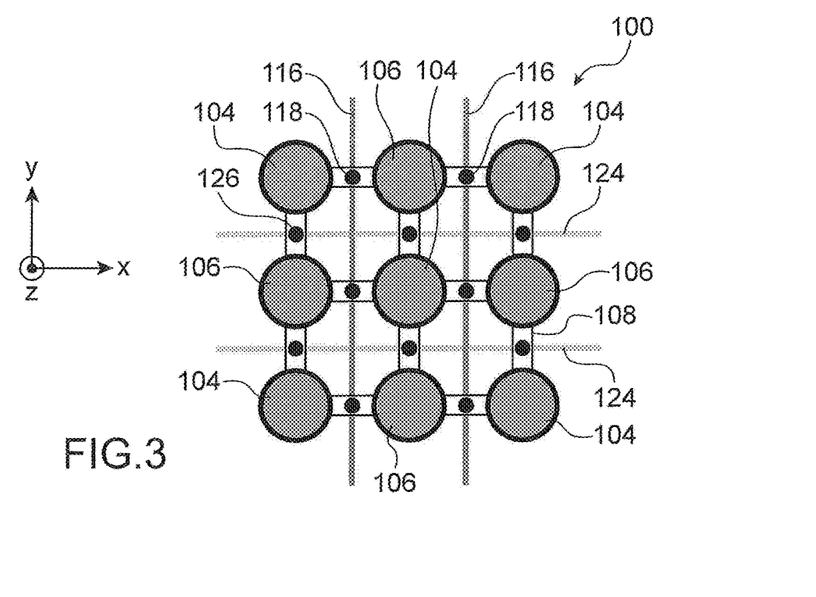

FIG. 2 corresponds to a diagrammatic perspective view of a part of the device 100, on which only two data qubits 104 and two measurement qubits 106 are shown. FIG. 3 corresponds to a diagrammatic top view of a part of the device 100, on which a 3×3 matrix comprising five data qubits 104 and four measurement qubits 106 is shown.

Figure 4:
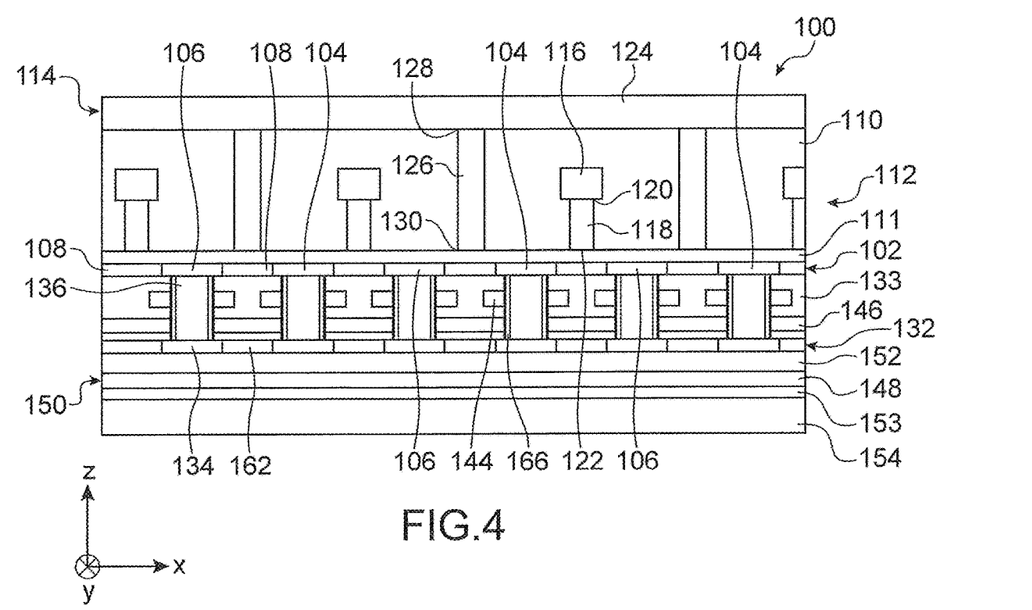

As shown on FIG. 4, the semiconducting layer 102 in which the qubits 104, 106 are fabricated is covered with a dielectric layer 111 and a dielectric material 110. Two metallisation layers are formed within this dielectric material 110. A first of two levels, referenced 112, is located between the semiconducting layer 102 and a second of the two levels, referenced 114.

The dielectric material 110 comprises for example $SiO_2$, or advantageously a dielectric material with a dielectric constant with a value less than the value of $SiO_2$ ("low-k" material), for example such as SiOCH or porous $SiO_2$.

Metallizations of the first level 112, called first conducting portions 116, form longitudinal portions extending along a first direction, in other words having their largest dimension approximately parallel to this first direction. This first direction is approximately parallel to the rows or columns of the qubits matrix 104, 106. On the first embodiment shown on FIGS. 2 to 5, the first conducting portions 116 extend parallel to the Y axis, in other words parallel to the columns of the qubits matrix 104, 106 shown on these figures. Each of the first conducting portions 116 extends facing the tunnel barriers 108 connecting the qubits 104, 106 forming two adjacent columns of the matrix. Thus for a qubits matrix 104, 106 with dimensions n×n, the first metallisation level 112 comprises (n−1) first conducting portions 116 each extending above the tunnel barriers 108 connecting the qubits 104, 106 belonging to two adjacent columns in the matrix.

First electrically conducting vias 118 are made in the part of the dielectric material 110 located between the first metallisation level 112 and the dielectric layer 111. Like the first conducting portions 116, these first vias 118 are located facing the tunnel barriers 108 each of which connects two adjacent qubits 104, 106 belonging to two adjacent columns. Each of the first vias 118 comprises a first end 120 electrically connected to one of the first conducting portions 116, and a second end 122 close to one of the tunnel barriers 108 but such that the dielectric layer 111 is present between this second end 122 and said tunnel barrier 108. The thickness of this dielectric layer 111 may for example be between about 2 nm and 20 nm.

The material of this dielectric layer 111 is such that it advantageously has a dielectric constant higher than that of $SiO_2$ ("High-k material"), and for example may be an $SiO_2/HfO_2$, $SiO_2$/silicon nitride bilayer, or it may include SiCO.

Metallizations of the second level 114, called second conducting portions 124, form longitudinal portions extending along a second direction approximately perpendicular to the first direction of the first conducting portions 116. On FIGS. 2 to 4, the second conducting portions 124 extend parallel to the X axis, in other words parallel to the rows of the qubits matrix 104, 106 shown on these figures. Each of the second conducting portions 124 extends facing the tunnel barriers 108 connecting the qubits 104, 106 forming two adjacent rows of the matrix. Thus for a qubits matrix 104, 106 with dimensions n×n, the second metallisation layer 114 comprises (n−1) second conducting portions 124 each extending above the tunnel barriers 108 connecting the qubits 104, 106 belonging to two adjacent rows in the matrix.

Second electrically conducting vias 126 are made in the part of the dielectric material 110 located between the second metallisation layer 114 and the dielectric layer 111. Like the second conducting portions 124, these second vias 126 are located facing the tunnel barriers 108 each of which connects two adjacent qubits 104, 106 belonging to two adjacent rows. Each of the second vias 126 comprises a first end 128 electrically connected to one of the second conducting portions 124, and a second end 130 close to one of the tunnel barriers 108 but such that the dielectric layer 111 is present between this second end 130 and said tunnel barrier 108.

In the device 100, qubits 104 and 106 are not addressed through electrical connections each connected directly to one of the qubits 104, 106, but instead through conducting portions 116, 124 and conducting vias 118, 126 that can be used to control the location of the addressed qubit through control of conduction within the tunnel barriers 108 by the field effect, in a similar manner to the gates of field effect transistors. Therefore the conducting portions 116, 124 and the conducting vias 118, 126 can be seen as forming gates controlling electrical conduction in tunnel links between qubits 104, 106. On the example in FIG. 3, the electrical potential within the data qubit 104 located at the centre of the matrix shown is controlled through two first conducting portions 116 and two second conducting portions 124 that can be seen on this figure and that are adjacent (top view) to this qubit 104, and by first and second conducting vias 118, 126 located above the tunnel barriers 108 connecting this data qubit 104 to the four measurement qubits 106 located around this data qubit 104.

For an n×n qubits matrix 104, 106, each of the conducting portions 116, 124 can be used to act on n tunnel barriers 108, and therefore on the electrical potentials of 2n qubits 104, 106 (those connected through said n tunnel barriers 108). Regardless of the value of n, only two metallisation levels are sufficient to address all qubits in an n×n qubits matrix. For such an n×n qubits matrix, 2(n−1) conducting portions and 2n(n−1) conducting vias are therefore sufficient to individually address each of the qubits in the matrix. Considering that each conducting via acts on one tunnel barrier 108 connecting two qubits 104, 106, a maximum of n(n−1) qubits could be addressed individually and simultaneously.

Apart from the semiconducting layer 102 called the first semiconducting layer 102 in which the qubits 104, 106 and the tunnel barriers 108 are fabricated, and the metallisation levels 112, 114 forming the addressing means of qubits 104, 106, the device 100 also comprises a second semiconducting layer 132 in which the charge detectors 134 that will detect charges are located, and also exchange charges (electrons or holes) with the qubits 104, 106. The physical characteristics (size, spacing, materials, etc.) of these charge carriers 134 are similar to those of data qubits 104 and measurement qubits 106.

The first semiconducting layer 102 is located between the second semiconducting layer 132 and the first metallisation level 112. Another dielectric layer 133 is interposed between the first semiconducting layer 102 and the second metallisation level 132.

Each charge detector 134 is formed from a portion of the second semiconducting layer 132, for example with dimensions similar to those of qubits 104, 106. For example, the section of each charge detector 134 in the plane of the second semiconducting layer 132, is approximately circular with a diameter equal to about 40 nm. Two adjacent charge detectors 134 are for example spaced one to the other at a distance between about 5 nm and 100 nm, for example of the order of 40 nm.

At least each measurement qubit 106, and possibly each data qubit 104, is connected to one of the charge detectors 134 facing this qubit 104, 106. Connections between the measurement qubits 106 (and possibly the data qubits 104) and the charge detectors 134 are formed by semiconducting portions 136 forming pillars extending between layers 102 and 132, in the dielectric layer 133. Therefore, the number of charge detectors 134 made in the second layer 132 and the number of semiconducting portions 136 are each equal to the number of measurement qubits 106 made in the first layer 102 when the charge detectors 134 are only connected to the measurement qubits 106, and each is equal to the total number of qubits 104, 106 when the charge detectors 134 are connected to the measurement qubits 106 and to the data qubits 104. Only one charge detector 134 and only one semiconducting portion 136 are shown on FIG. 5.

Furthermore, in this first embodiment, the charge detectors 134 are arranged by forming a second matrix similar to the first matrix formed from the qubits 104, 106, and therefore the device 100 comprises $n^2$ or $n^2/2$ charge detectors 134 (in the case of an n×n qubits matrix 104, 106).

Each charge detector 134 is connected to a reservoir of charge carriers (electrons or holes) that supply charge detectors 134s, then qubits 106 and possibly 104, with charge carriers. In the first embodiment described herein, the charge carriers 134 arranged on the same row or the same column of the second charge detectors matrix 134 are connected to the same doped portion 138 of the second semiconducting layer 132 extending parallel to this row or this column of charge detectors 134. In the example on FIG. 5, the doped portions 138 extend parallel to the X axis, in other words parallel to the rows of the charge detectors matrix 104. As a variant, the doped portions 138 can extend parallel to the Y axis, in other words parallel to the columns of the charge detectors matrix 104.

The charge detectors 134 are connected to the doped portions 138 by tunnel barriers 140. For example, the nature of these tunnel barriers 140 is similar to the tunnel barriers 108 connecting the qubits 104, 106 to each other, in other words formed from semiconducting portions with dimensions and shapes such that they form tunnel barriers.

The passage of charge carriers between the measurement qubits 106, or possibly the data qubits 104, and the charge detectors 134 is controlled by gates 142 each formed around portions 136. On FIG. 5, a first gate 142a and a second gate 142b are formed from portions of conducting material surrounding one of the portions 136, a dielectric material 166 being present between this portion 136 and this gate conducting material. Operation of these gates 142a, 142b is similar to operation of a gate of a transistor and they control the passage of charges in the portions 136, between one of the charge detectors 134 and one of the data or measurement qubits 104, 106, electrostatically and as a function of the electrical potential applied to them.

Figure 5:
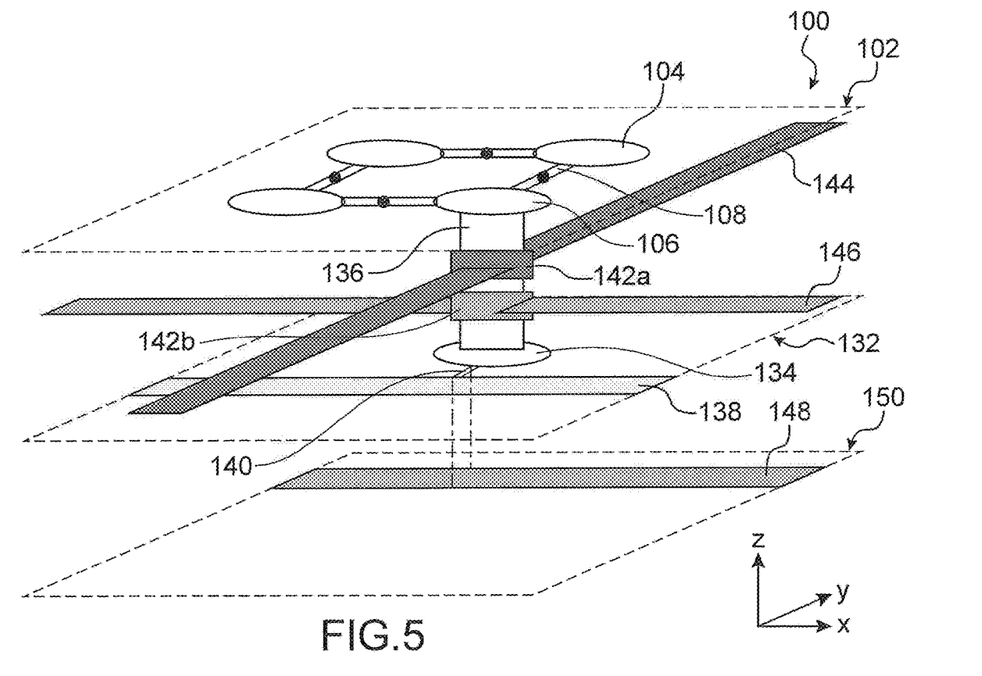

In the first embodiment described herein, the gates 142a, 142b are addressed thanks to third longitudinal conducting portions 144 that extend along a direction parallel to the rows or the columns of the qubits matrix 104, 106 (parallel to the columns in the example in FIG. 5, in other words parallel to the Y axis) and to fourth longitudinal conducting portions 146 that extend along a direction perpendicular to the direction of the third conducting portions 144 (parallel to the X axis in FIG. 5). In order to be able to individually address each measurement qubit 106 and possible each data qubit 104, each of the portions 136 is surrounded by two gates 142a, 142b formed by two distinct conducting portions spaced one to the other. The first gate 142a is connected to one of the third conducting portions 144 and the second gate 142b is connected to one of the fourth conducting portions 146.

Each of the third and the fourth conducting portions 144, 146 is connected to one of the two gates 142a, 142b formed around each of the portions 136 arranged on the same row or the same column. Thus, in the example on FIG. 5, the third conducting portion 144 shown is electrically connected to the first gate 142a shown and to the other first gates 142a located on the column to which the first gate 142a shown belongs. The fourth conducting portion 146 shown is electrically connected to the second gate 142b shown and to the other second gates 142b located on the row to which the second gate 142b shown belongs.

The passage of charge carriers in one of the portions 136 is controlled by applying appropriate electrical potentials on the third conducting portion 144 and on the fourth conducting portion 146 that are connected to the first and second gates 142a, 142b that surround this portion 136.

The third and fourth conducting portions 144, 146 are located in the dielectric layer 133.

In order to control the passage of charge carriers in the tunnel barriers 140 that connect the charge detectors 134 to the doped portions 138, fifth conducting portions 148 are formed within a conducting layer 150 located below the second semiconducting layer 132. There is no need for the tunnel barriers 140 to be addressed individually, but this is possible. Each of these fifth conducting portions 148 can simultaneously control the conductivity of a set of tunnel barriers 140, for example all tunnel barriers 140 associated with charge detectors 134 located on the same row as is the case on FIG. 5, or on the same column. These fifth conducting portions 148 comprise for example at least one metal and/or polycrystalline silicon.

Another dielectric layer 152 is interposed between the conducting layer 150 and the second semiconducting level 132. This dielectric layer 152 comprises for example a dielectric with high permittivity ("High-k") or oxide. The conducting layer 150 is supported on a holding assembly comprising a dielectric layer 153, for example comprising an oxide, and a support layer 154, for example a massive or bulk semiconducting layer. This dielectric layer 152 is fairly thin, for example between about 2 nm and 25 nm so that the fifth conducting portions 148 control the tunnel barriers electrostatically, in a manner similar to a transistor gate. To achieve this, the fifth conducting portions 148 are arranged to face the tunnel barriers 140.

Figure 6:
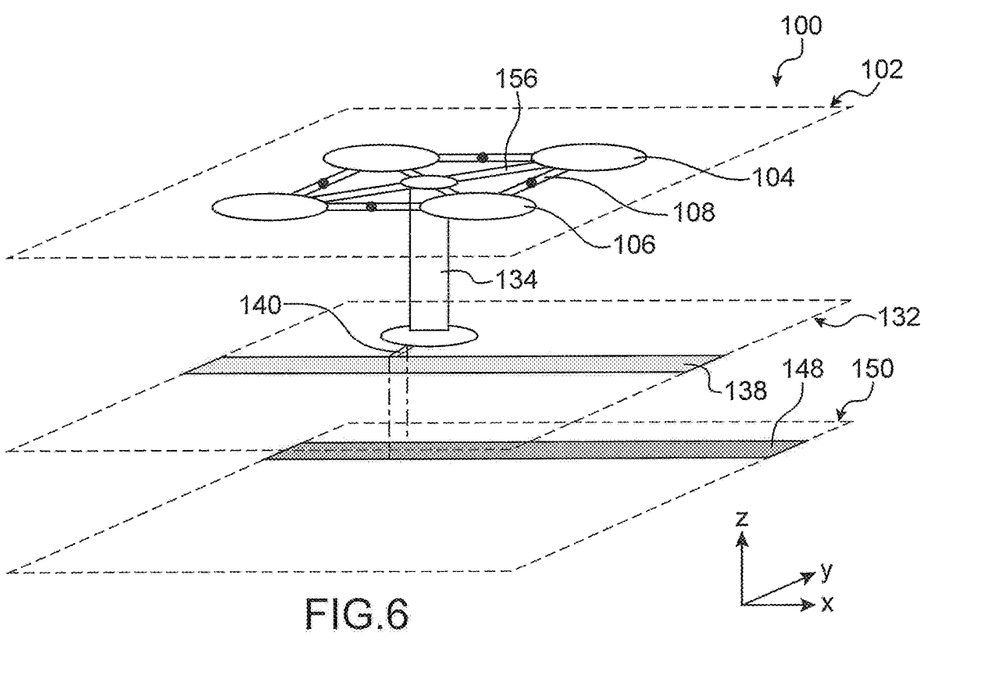
FIG. 6 diagrammatically shows a part of a quantum device according to a second embodiment.

FIG. 6 diagrammatically shows a part of the quantum device 100 according to a second embodiment.

In this second embodiment, each charge detector 134 is formed from a portion of semiconductor extending between two semiconductor layers 102, 132.

Furthermore, in the particular configuration shown on FIG. 6, and unlike the first embodiment in which each measurement qubit 106 and possibly each data qubit 104 is directly connected to a charge detector 134 that is specific to it, each charge detector 134 in this case is common to several measurement qubits 106, and possibly common to several measurement qubits 106 and data qubits 104. In this example, each charge detector 134 is common to four qubits 104, 106 arranged to form a 2×2 matrix and that, as seen in a top view, are arranged around the charge detector 134. Therefore in this second embodiment, the device 100 comprises a number of charge detectors 134 equal to $n^2/4$.

In addition to the tunnel barriers 108 connecting the qubits 104, 106 to each other, other semiconducting portions of the layer 102 form tunnel barriers 156 connecting each charge detector 134 to each of the data and measurement qubits 104, 106 associated with this charge detector 134.

As a variant, the charge detectors 134 can be connected to measurement qubits 106 only. In this case, each charge detector 134 can be connected to two measurement qubits 106 through two tunnel barriers 156.

As in the first embodiment, each charge detector 134 is connected to a charge carriers reservoir to supply charge carriers to charge detectors 134, formed by a doped portion 138 of the semiconducting layer 132. Furthermore, the charge detectors 134 are connected to doped portions 138 through tunnel barriers 140 that, as in the first embodiment, are controlled by the fifth conducting portions 148 formed within the conducting level 150.

Unlike the first embodiment in which liaisons between the data and measurement qubits 104, 106 and the charge detectors 134 are controlled by the gates 142 and the third and fourth conducting portions 144, 146, these tunnel barriers 156 in this case are controlled by tunnel coupling which is modulated via first and second conducting portions 116, 126 that act indirectly on these links 156. The gates formed by the portions 116, 126 can "push" the wave function of the charge of the qubit considered towards the charge detector 134, which is equivalent to lowering the tunnel barrier 156. These gates can also push this wave function away and thus increase the level of the tunnel barrier 156.

One method of fabricating the quantum device 100 according to one particular embodiment is now described with reference to FIGS. 7A to 7L.

Figure 7A:
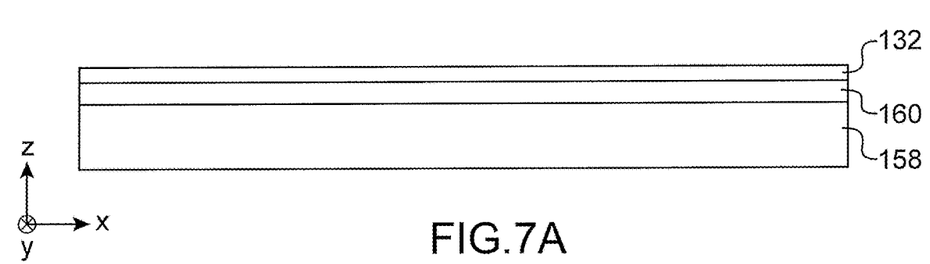
FIGS. 7A to 7L show the steps in a method of making a quantum device according to one particular embodiment.

The device 100 is made from an SOI substrate comprising a solid semiconducting layer 158, for example comprising silicon, a buried dielectric layer 160, for example comprising $SiO_2$, and a surface semiconducting layer, for example comprising silicon, corresponding to the second semiconducting layer 132 (FIG. 7A). The thickness of the second semiconducting layer 132 may for example be between about 5 nm and 30 nm.

Figure 7B:
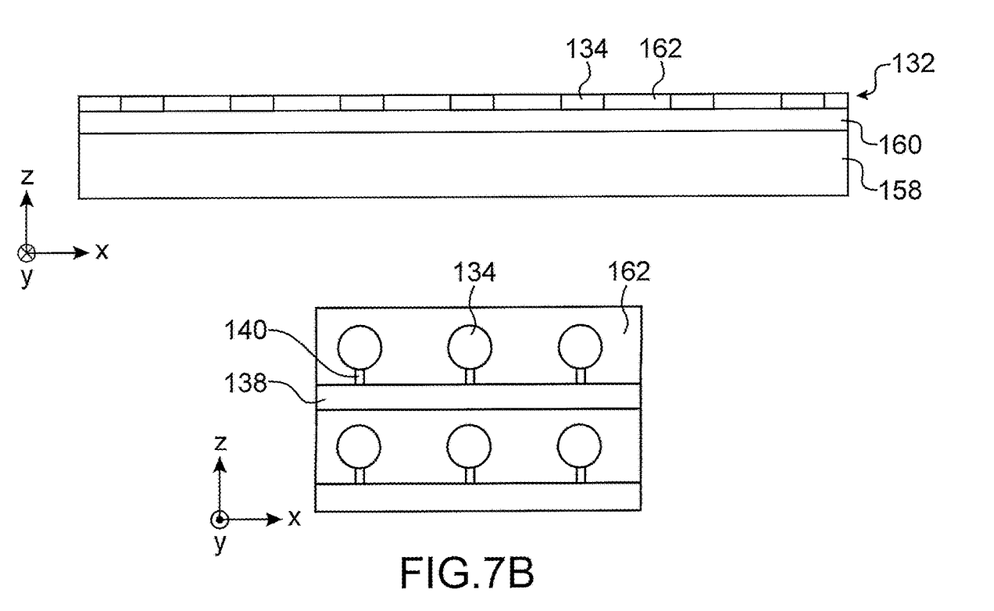

As shown on FIG. 7B, the second semiconducting layer 132 is etched such that the remaining portions of this layer form charge detectors 134 at a spacing from each other. In the example described herein, the charge detectors 134 are made as semiconductor portions with an approximately circular section in the plane of the layer 132 ((X,Y) plane). Other remaining portions 138 of this semiconducting layer present between the charge conductors 134 are doped so as to form charge carrier reservoirs. Finally other remaining portions of this layer form fourth tunnel barriers 140.

A dielectric material 162 is then deposited so as to fill the spaces formed in the layer 132, between charge detectors 134, portions 138 and tunnel barriers 140. Planarization is carried out to eliminate the dielectric material deposited, thus forming electrical insulation around these elements.

Figure 7C:
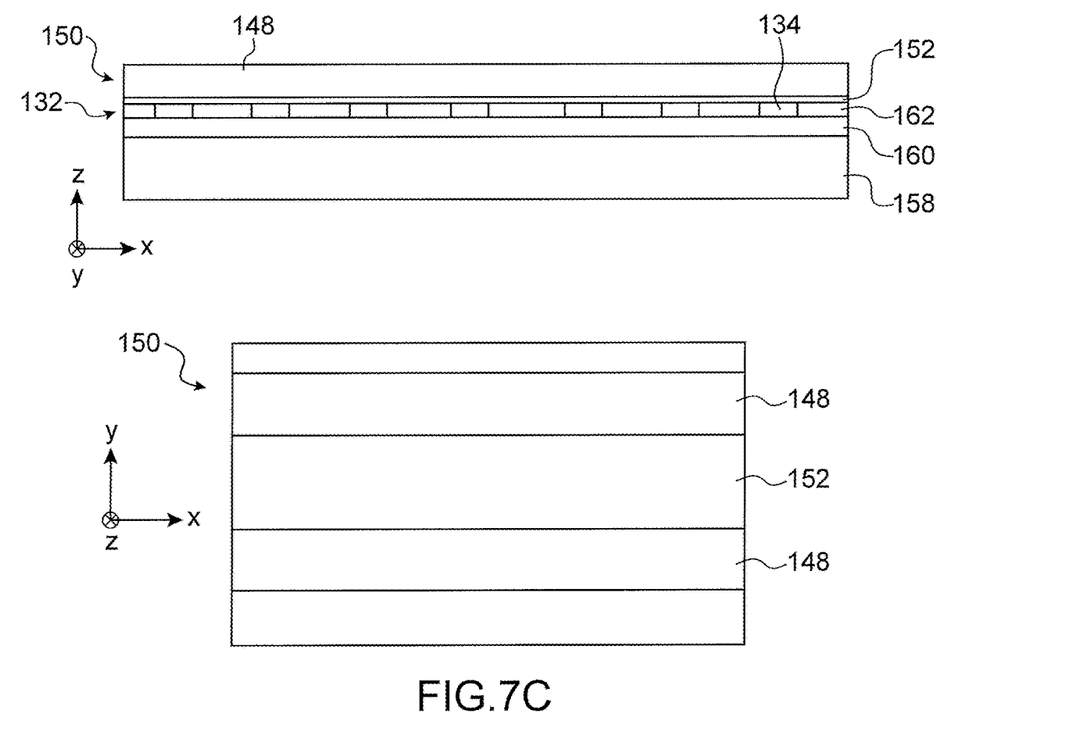

The conducting level 150 is then made. This is done by making a stack of layers comprising the dielectric layer 152 and an electrically conducting layer, for example metallic or containing doped polysilicon, on the detection elements 134 and the dielectric material 162. The electrically conducting layer is then etched with stopping on the dielectric layer 152 so as to form fifth conducting portions 148 that will control the passage of charge carriers in the tunnel barriers 140 that will connect the charge detectors 134 to the doped portions 138 (FIG. 7C).

Figure 7D:
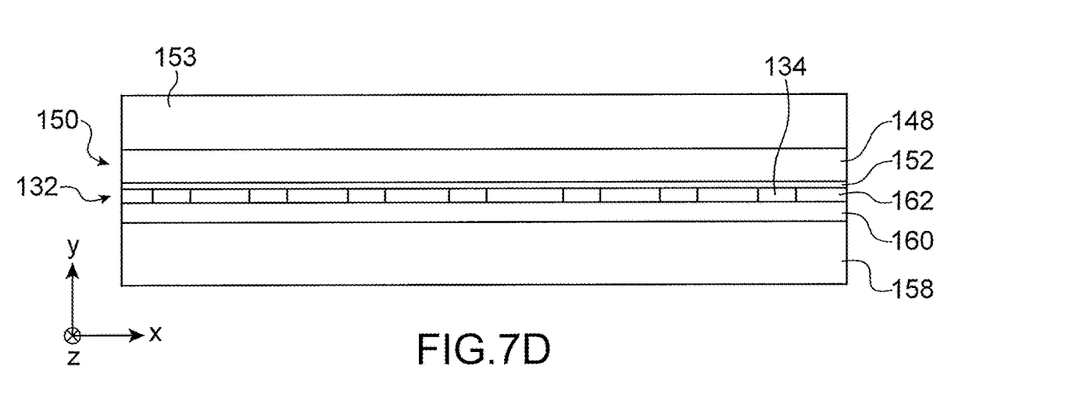

A dielectric material, for example semiconductor oxide, is then deposited on the conducting level 150, and particularly between the fifth conducting portions 148, and is then planarized to form portions which insulate the fifth conducting portions 148 and the dielectric layer 153 (FIG. 7D).

Figure 7E:
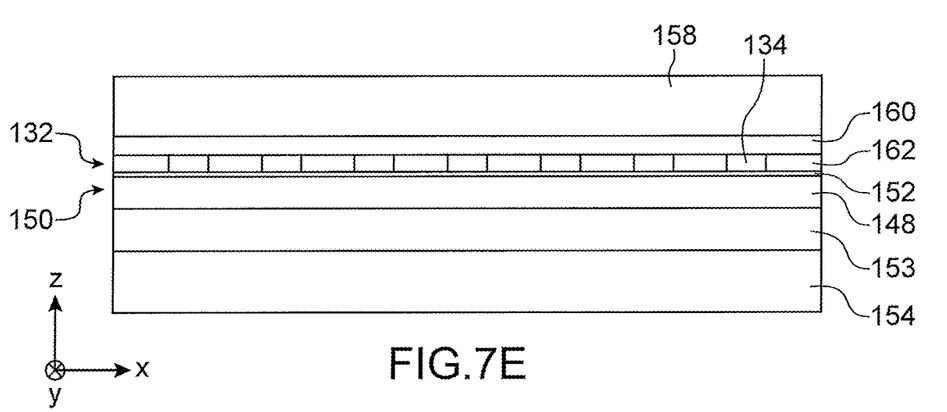

The assembly is then turned over and fixed onto the support layer 154 that will mechanically support the assembly (FIG. 7E).

Figure 7F:
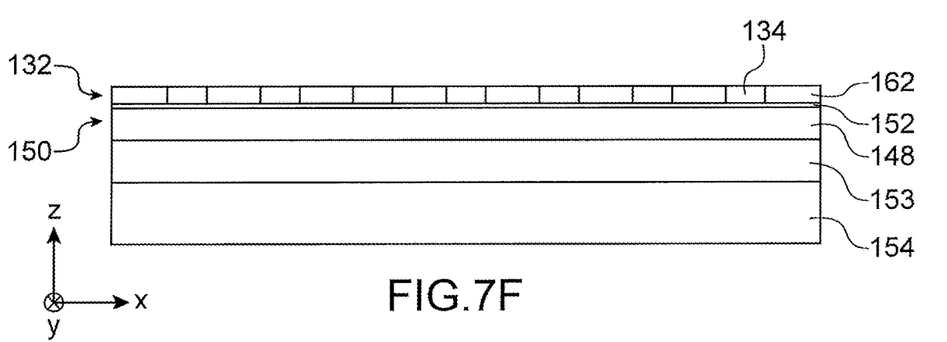

The layers 158 and 160 of the initial substrate are then removed, revealing the back face of the second semiconducting layer 132, making the charge detectors 134 accessible (FIG. 7F).

Figure 7G:
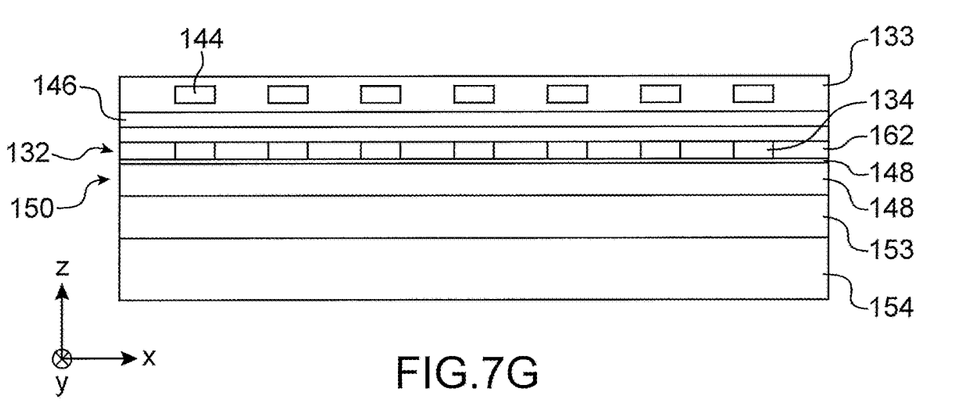

The conducting portions 144 and 146 and the gates 142 are then made by several deposition and etching steps of conducting materials (for example polysilicon or metallic gate materials such as TiN or tungsten), and several intermediate deposits of a dielectric material and planarizations (or depositions of an HSQ (hydrogen-silsesquioxane) type of planarizing oxide) to form the dielectric layer 133 (FIG. 7G). The thickness of the assembly formed from the conducting layers 144, 146 and the dielectric layer 133 may for example be between about 5 nm and 20 nm.

Vias 164 are then made through the dielectric layer 133 and the conducting materials of the portions 144, 146 and gates 142 so as to form housings for the semiconducting portions 136. These vias 164 are made through the use of etching with stopping on the semiconductor of layer 132.

Figure 7H:
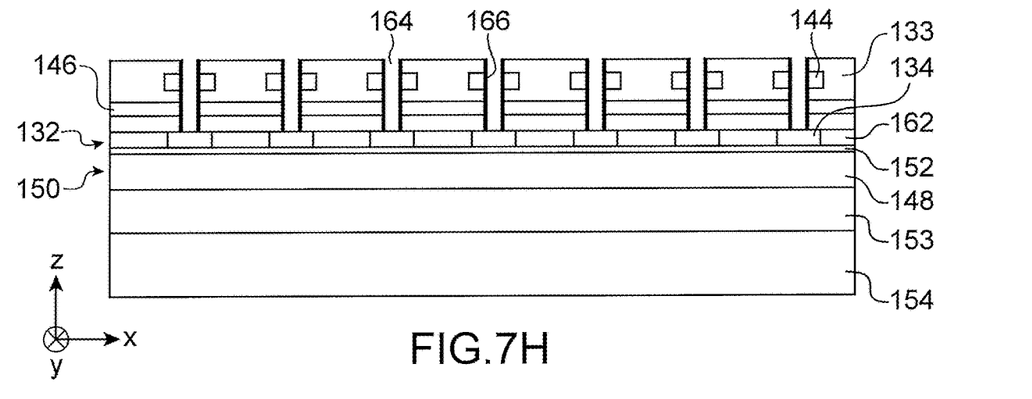

Dielectric material, for example a semiconductor oxide such as $SiO_2$ or a semiconductor nitride, is then deposited, particularly covering the lateral walls of the vias 164. An anisotropic etching is then used to keep only the parts 166 of this dielectric material arranged in contact with the lateral walls of the vias 164 (FIG. 7H). These parts of dielectric material 166 are intended to form gate dielectrics between the gates 142 and the semiconducting portions 136.

Figure 7I:
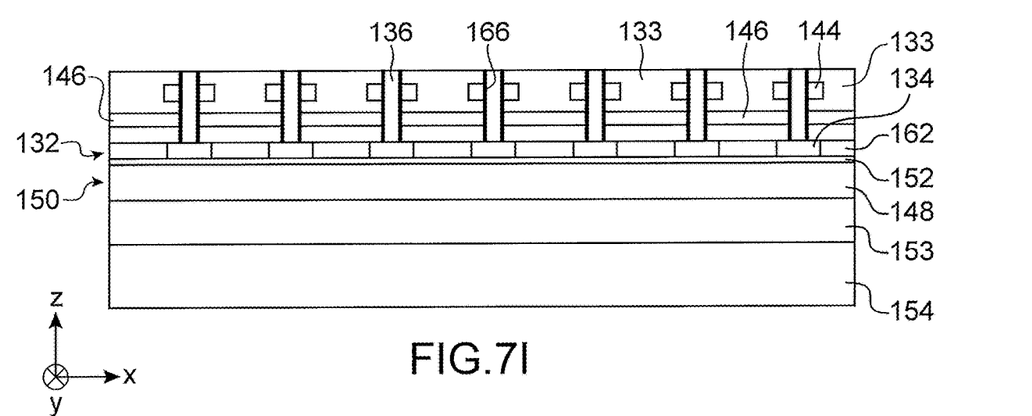

After cleaning, the semiconductor is epitaxied to form the portions 136. Formation of the portions 136 also includes the use of chemical-mechanical planarization with stopping on the dielectric layer 133 to eliminate the semiconductor obtained by growth located outside the vias 164 (FIG. 7I).

Figure 7J:
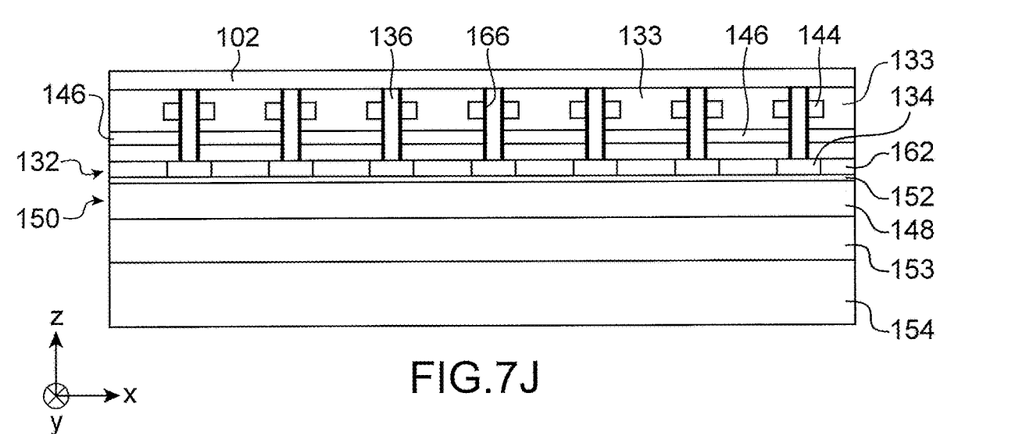

The semiconducting layer 102 is then formed on the top face of the assembly formed by the dielectric layer 133, the semiconducting portions 136 and the parts 166 of this dielectric material, for example by direct hydrophobic or hydrophilic bonding (FIG. 7J).

The data and measurement qubits 104, 106 are then formed in the semiconducting layer 102 by etching.

Figure 7K:
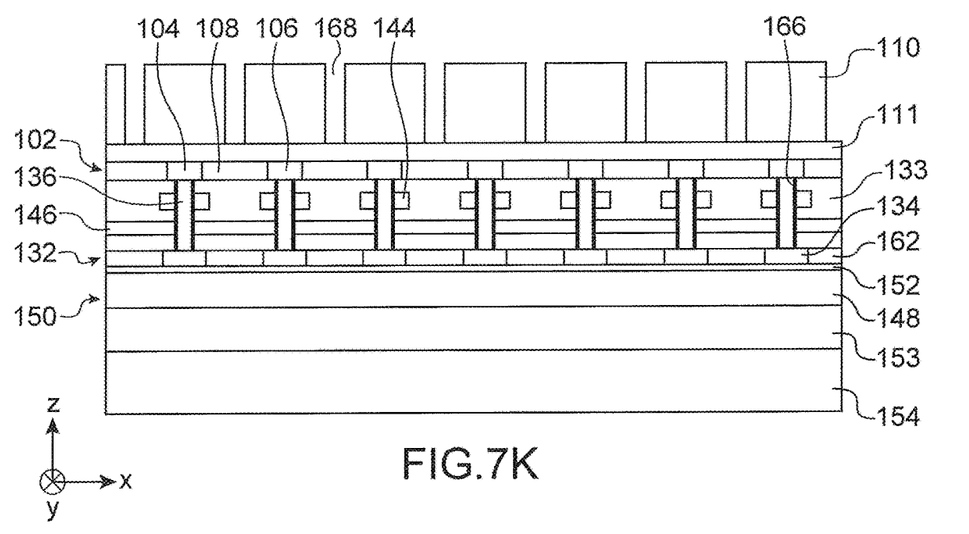

The dielectric layer 111 is then made, then part of the dielectric material 110, for example comprising $SiO_2$, is also made on the dielectric layer 111. Vias 168 are then made through the dielectric material 110, the dielectric layer 111 for example being such that it can act as a stop layer for this etching (FIG. 7K). For example, the dielectric layer 111 comprises nitride or a silicon oxide/nitride dual layer such as nitride which act as a stop layer, can be etched afterwards following etching used to make the vias 118, 126.

Figure 7L:
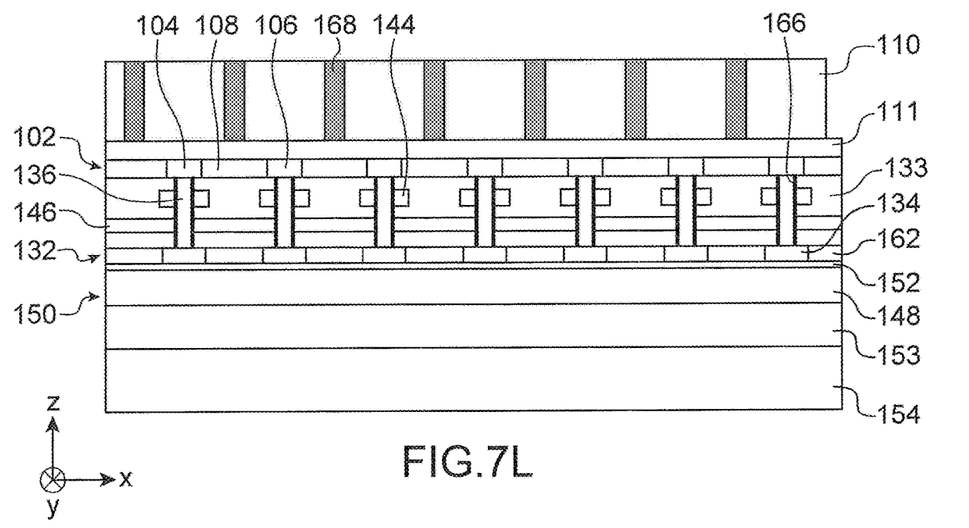

Conducting material is then deposited in the vias 118, forming conducting vias (FIG. 7L).

Metallisation levels 112, 114 are made by successively implementing a sequence consisting of a step to deposit and etch a conducting material to form conducting portions 116; then deposition and etching of another part of the dielectric material 110 for fabrication of vias 126, and finally steps to deposit and etch a conducting material to form conducting portions 124.

The structure obtained after these steps corresponds to that shown in FIG. 4.

The invention claimed is:

1. A quantum device with spin qubits, comprising at least:
a first semiconducting layer comprising a first matrix of data spin qubits and measurement spin qubits connected to each other through tunnel barriers in the first semiconducting layer;
means of addressing the data spin qubits and the measurement spin qubits, configured for controlling, by using a field effect, conduction of each of the tunnel barriers separating the data spin qubits from respective adjacent measurement spin qubits of the measurement spin qubits and comprising at least:
first and second electrically conducting portions arranged in first and second superposed metallization levels respectively;
first and second electrically conducting vias each comprising a first end and a second end, wherein the first ends are connected to one of the first and second electrically conducting portions; and
a first dielectric layer interposed between the tunnel barriers and the second ends of the first and second electrically conducting vias.

2. The quantum device according to claim 1, wherein:
in the first matrix, the data spin qubits and the measurement spin qubits are aligned in first and second directions perpendicular to each other forming rows and columns of the first matrix;
the second ends of the first electrically conducting vias are arranged facing respective first tunnel barriers of the tunnel barriers, each of the first tunnel barriers connecting one of the data spin qubits and one of the adjacent measurement spin qubits and located on a same row of the first matrix;
the second ends of the second electrically conducting vias are arranged facing respective second tunnel barriers of the tunnel barriers, each of the second tunnel barriers connecting one of the data spin qubits and one of the adjacent measurement spin qubits and located on a same column of the first matrix.

3. The quantum device according to claim 2, wherein each of the first electrically conducting portions is connected to the respective first ends of the first conducting vias, the seconds ends of which are facing the first tunnel barriers connecting the data spin qubits and the measurement spin qubits located on two adjacent columns of the first matrix, and wherein each of the second electrically conducting portions is connected to the respective first ends of the second conductor vias, the second ends of which are facing the second tunnel barriers connecting the data spin qubits and the measurement spin qubits located on two adjacent rows of the first matrix.

4. The quantum device according to claim 1, further comprising:
a second semiconducting layer comprising a charge detectors matrix, each of the measurement spin qubits being electrically connected to a respective charge detector of the charge detectors matrix through a respective first semiconducting portion extending between the first and second semiconducting layers, each of the respective first semiconducting portions being coupled to at least one gate configured for controlling tunnel coupling between the respective charge detector of the charge detectors matrix and a corresponding one of the measurement qubits connected through said first semiconducting portion.

5. The quantum device according to claim 2, further comprising:
a second semiconducting layer comprising a charge detectors matrix, each of the measurement spin qubits being electrically connected to a respective charge detector of the charge detectors matrix through a respective first semiconducting portion extending between the first and second semiconducting layers, each of the respective first semiconducting portions being coupled to at least one gate configured for controlling tunnel coupling between the respective charge detector of the charge detectors matrix and a corresponding one of the measurement qubits connected through said first semiconducting portion, and in which each of the first semiconducting portions is coupled to a first gate and to a second gate configured for controlling tunnel coupling between the respective charge detector and the corresponding one of the measurement qubits connected through said first semiconducting portion and in which each of the first semiconducting portions is distinct and at a distance from each other, and in which the quantum device also includes:
third electrically conducting portions each connected to respective first gates located around respective ones of the first semiconducting portions connected at least to corresponding measurement spin qubits located on a corresponding same column of the first matrix;
fourth electrically conducting portions each connected to respective second gates located around respective ones of the first semiconducting portions connected at least to corresponding measurement spin qubits located on a corresponding same row of the first matrix.

6. The quantum device according to claim 5, in which the first and second gates are coatings and each is located around one of these first semiconducting portions.

7. The quantum device according to claim 1, further comprising:
a second semiconducting layer and a charge detectors matrix formed from second semiconducting portions extending between the first and second semiconducting layers, each of said second semiconducting portions being connected by at least a third tunnel barrier to at least a first one of the measurement spin qubits, located in a plane of the first semiconducting layer, around said second semiconducting portion.

8. The quantum device according to claim 7, wherein each of the second semiconducting portions is connected by at least a fourth tunnel barrier to at least a second one of the measurement spin qubits, located in the plane of the first semiconducting layer around said second semiconducting portion.

9. The quantum device according to claim 4, wherein the first semiconducting layer is located between the second semiconducting layer and the first and second metallization levels.

10. The quantum device according to claim 4, wherein the second semiconducting layer comprises doped portions configured for forming charge carrier reservoirs to which charge detectors of the charge detectors matrix are connected using tunnel barriers.

11. The quantum device according to claim 10, wherein each of the doped portions is connected to several charge detectors of the charge detectors matrix arranged on a same row or a same column of the charge detectors matrix.

12. The quantum device according to claim 10, further comprising second gates configured for controlling conduction by field effect of the tunnel barriers connected to the charge carrier reservoirs.

13. The quantum device according to claim 12, wherein the second gates are formed by fifth electrically conducting portions extending parallel to at least one of the rows and columns of the first matrix, arranged facing the tunnel barriers connected to the charge carrier reservoirs and spaced by a second dielectric layer from the tunnel barriers connected to the charge carrier reservoirs.

14. The quantum device according to claim 13, in which the fifth electrically conducting portions are formed in a conducting level such that the second semiconducting layer is located between the first semiconducting layer and the conducting level.

15. The quantum device according to claim 1, wherein the first and second electrically conducting portions are arranged orthogonally in the first and second superposed metallization levels respectively.

16. A method of making a quantum device with spin qubits, comprising at least:

fabrication, in a first semiconducting layer, of a first matrix of data spin qubits and measurement spin qubits connected to each other through tunnel barriers in the first semiconducting layer;

fabrication of a first dielectric layer on the first semiconducting layer;

fabrication of first and second electrically conducting portions arranged in first and second superposed metallization levels respectively;

fabrication of first and second electrically conducting vias each comprising a first end and a second end, wherein the first ends are connected to one of the first and second electrically conducting portions respectively such that the first dielectric layer is interposed between the tunnel barriers and the second ends of the first and second electrically conducting vias.

17. The method of making a quantum device with spin qubits according to claim 16, wherein the first and second electrically conducting portions are fabricated orthogonally in the first and second superposed metallization levels respectively.

* * * * *